United States Patent [19]
Wright, Jr.

[11] Patent Number: 5,347,245
[45] Date of Patent: Sep. 13, 1994

[54] CATV SIGNAL SPLITTER

[75] Inventor: W. Andrew Wright, Jr., Bethlehem, Pa.

[73] Assignee: Bark Lee Yee, Allentown, Pa.; a part interest

[21] Appl. No.: 148,254

[22] Filed: Nov. 5, 1993

[51] Int. Cl.$^5$ .............................. H03H 7/48
[52] U.S. Cl. .................... 333/131; 333/119
[58] Field of Search ................. 333/119, 131

[56] References Cited

U.S. PATENT DOCUMENTS 3,146,409  8/1964  Lalmond .............................. 333/131
4,275,365  6/1981  Ando .................................. 333/131

*Primary Examiner*—Paul Gensler
*Attorney, Agent, or Firm*—William H. Eilberg

[57] ABSTRACT

A signal splitter circuit accepts an input signal and conveys the input signal to two output ports. The circuit operates with minimal attenuation, throughout a very wide bandwidth, and also effectively isolates the output ports from each other. The signal from the input port is coupled to an autotransformer, and the ends of the autotransformer are connected to the respective output ports. A bridge load circuit which includes a transformer winding and a load connected in parallel, is inductively coupled to the autotransformer. The bridge load circuit has no connection to the splitter circuit, other than through the inductive coupling. The splitter circuit also includes inductors in series with the output ports and capacitors in parallel with the output ports. The circuit provides a balanced bridge circuit which cancels signals traveling between the output ports, and the inductors and capacitors provide impedance matching between the input port and output ports. The arrangement of the bridge load circuit places the leakage inductance of the autotransformer outside the effective path of the bridge load circuit, so that the leakage inductance cannot cause unwanted and unpredictable phase shifts at high frequencies.

14 Claims, 2 Drawing Sheets

CATV SIGNAL SPLITTER

BACKGROUND OF THE INVENTION

This invention relates to the field of signal splitters for use in CATV distribution systems, and in other applications in which signals, having a wide range of frequencies, are distributed across various output ports. The invention is therefore not necessarily limited to use in CATV system.

At literally thousands of locations in a CATV (community antenna television) distribution system, an incoming signal must be split among two or more outgoing branch circuits. The signal splitters that divide the signal among the outgoing branches must fulfill several challenging performance criteria. First, the CATV signal has a very broad bandwidth, currently ranging from 5-552 MHz. In the foreseeable future, the upper limit will reach 1000 MHz (1 GHz), so the total bandwidth will approach eight octaves of range. At 1 GHz, conventional printed circuit boards and wire lead components do not perform acceptably.

Secondly, over the frequency range of the signal, the power loss must be uniform, within a small fraction of a decibel. During its trip from the head-end of the system to a subscriber's home, the signal must pass through more than a dozen splitters. Any attenuation in the splitter will be multiplied by the number of splitters in the line.

Thirdly, the splitters must have very good output return loss. This means that any signals flowing back from one of the output branch circuits should be absorbed by the splitter, and not reflected back down the branch circuit. Signals that are so reflected appear as "ghost" images on a subscriber's television set.

Fourthly, the splitters must have very good output isolation. This means that a signal entering or exiting one of the output ports should not appear at another output port. If a signal could travel from one output port to another, a neighbor's television reception would be degraded.

FIG. 1 shows a basic splitter circuit of the prior art. The circuit is of the type which produces equal outputs. It is also possible to provide a circuit with unequal outputs, but the latter circuit is outside the scope of the present invention. The circuit of FIG. 1 includes an input port and two output ports. Multiple output ports can be accommodated by constructing binary "trees" each comprising the basic splitter circuit. That is, each output port of a given signal splitter circuit is connected to the input port of another identical splitter circuit. In this way, a plurality of splitter circuits are connected in a cascading arrangement, so that a single input signal can be split into an arbitrarily large number of output signals.

If both output ports are loaded with impedance $Z_o$, then the currents induced by an input voltage at point B, flowing through windings N3 and N4 of T2, should be equal. If N3=N4, the magnetic fields induced in the core of T2 by these currents should be equal and opposite, and there is no net voltage between points C and D. The load at point B, as seen from the input port, is the parallel combination of the loads on the output ports A and B, or $Z_o/2$. In order to provide correct impedance matching, T1 is used to transform the input impedance by a factor of 2. Hence, the ratio of turns N1+N2 to N2, of T1, should be $(2)^{.5}$.

If reflected energy appears at output port A, it is absorbed by two impedances in series. The first one is the input source impedance $Z_o$, transformed down by a factor of 2 by T1, resulting in a load of $Z_o/2$. The second one is the load resistor R1, which is chosen to have impedance $2Z_o$, transformed down by T2 to $Z_o/2$, according to the square of the turns ratio (N3+N4)/N3. These two impedances in series combine to form $Z_o$ exactly, for a perfect match.

In the case of reflected energy appearing at output port A, the two equal series load impedances result in a voltage at point B which is exactly one-half the magnitude, and the same phase, as the voltage at point C. It is assumed that the windings of T2 have equal numbers of turns, i.e. N3=N4. Then these windings set the voltage between points B and C to exactly one-half the voltage between points C and D. Thus, the voltage at point D is zero, implying that no energy reflected back into output port A will appear at output port B.

The design of a signal splitter capable of good performance over a broad frequency range presents substantial problems. While one can obtain load resistors which are nearly ideal over the range of 5-552 MHz, transformers T1 and T2 will exhibit significant deviations from the ideal. To first order, one can consider these deviations equivalent to adding impedances in series and in parallel to each transformer winding. The parallel impedance represents core magnetization current and losses in the transformer. Transformer core manufacturers specify the parallel impedance induced in a one-turn winding over the range of operating frequencies. This parallel impedance can be controlled within a 20% tolerance, which is quite acceptable for a second order effect.

The series impedance, on the other hand, poses a more difficult problem. The series impedance is largely due to leakage inductance resulting from the fact that all of the magnetic field induced by the current in each turn of every winding on a core does not pass through all of the other turns. The amount of leakage inductance is determined by both the core material and the physical layout of the windings. Transformer manufacturers do not specify such effects, and the windings are made by hand on very tiny cores. Thus, there is wide variation in the series impedance, frequently requiring adjustment in the final product by manual spreading of the turns.

Several techniques can be used to compensate for the equivalent parallel impedance introduced by T1 and T2. First, identical cores can be used for T1 and T2, and windings N2, N3, and N4 can all be set equal. In this case, the critical output isolation, between output ports A and B, will be maintained independent of the exact value of the parallel core losses.

Secondly, one can take advantage of the fact that the parallel core loss impedance of good wideband ferrite core material is almost perfectly resistive and fairly constant over most of its intended bandwidth. Thus, the value of the load resistor R1 can be increased and the input matching transformer ratio (N1+N2)/N2 can be decreased to compensate for the addition of this parallel resistance.

The above-described compensation technique can be extended to deal with the case where N2 is not chosen to be equal to N3 and N4. The primary limitation to such compensation arises from the more severe limitations imposed by performance degradation due to series leakage inductance.

Compensation for the equivalent series impedance introduced by leakage inductance in T1 and T2 is the single most important determinant of splitter performance. FIG. 2 shows a typical prior art circuit which attempts to compensate for leakage inductance. Since the leakage impedance is largely inductive, the classical solution was to add capacitors to ground so as to form, effectively, multiple LC transmission line half-sections with the distributed series inductance. The half-sections should have opposing orientations, and each should have a natural impedance equal to the circuit impedance at that point. This means that the impedance should be $Z_o = L_s/C$, where $L_s$ is the leakage inductance. The capacitance of $C_1$ can be viewed as the sum of three capacitances in parallel, one capacitance forming a transmission line half section with the leakage inductance of T1, and the other two forming transmission line half sections with the leakage inductances of the two halves of T2. The capacitance of the output connectors to ground also forms a transmission line half section with a part of the series leakage inductances of T2.

A major practical limitation to transmission line leakage inductance compensation, at frequencies over 300–500 MHz is the lead inductance of C1. Frequently, C1 is implemented as several capacitors in parallel, to reduce this parasitic effect.

The prior art circuit of FIG. 2 compensates for the output isolation degradation due to the leakage inductance of T2 by adding inductors L1 and L2 in series with the load resistor R1. A signal originating at one output port flows through two parallel paths, one path passing through T2 and the other path passing through L1, L2 and R1, to reach the other output port. The signals in these paths are 180° out of phase, due to the action of transformer T2. The magnitude of these signals are adjusted to be equal so that the signals therefore cancel. Thus, no signal originating at one of the output ports appears at the other output port.

However, the circuit of FIG. 2 has the disadvantage that when the high frequency attenuation is balanced in the two paths, the phase shift through transformer T2 is significantly greater than that of the path containing L1, L2, and R1. This effect limits the ability of the circuit to provide the desired signal isolation. This effect is due to the fact that one of the signal paths, namely the path through T2, contains two transmission line half-sections. These half-sections introduce the unwanted rapid phase shift.

The present invention provides a signal splitter which has all of the desirable characteristics outlined above, namely, satisfactory operation across a wide bandwidth, output isolation, and acceptable impedance matching, but which also easily compensates for leakage inductance in the transformer. The circuit of the present invention is also especially easy to realize using surface mount technology (SMT), which is the technique of choice when dealing with high frequency signals.

SUMMARY OF THE INVENTION

In the signal splitter of the present invention, there is an input port and two output ports. A signal from the input port is connected to the center tap of an autotransformer, the ends of the coupled inductors forming the autotransformer being connected to the output ports. A bridge load circuit, comprising an inductor connected in parallel with a load, is connected to the autotransformer by inductive coupling only. There is no other connection between the bridge load circuit and the signal splitter.

The bridge load circuit, through inductive coupling to the auto-transformer windings, effectively provides a $Z_o/2$ load between the center tap of the autotransformer and the output ports. The transformed load in series with the $Z_o/2$ transformed input source impedance provides the desired isolation of the output ports, as described in the classical splitter design.

More significantly, because the bridge load circuit is coupled only inductively to the autotransformer, the series leakage inductance of the autotransformer windings lies outside the path of the bridge load circuit. Thus, the leakage inductance does not cause a high frequency phase shift problem, as was true in the circuits of the prior art. Elimination of the inductors in series with the load resistor makes it significantly easier to implement the present circuit using surface mount technology (SMT). Input and output impedances can be matched by simple choice of (optional) inductances placed in series with the output ports and capacitances, connected between the output ports and ground.

The present invention therefore has the primary object of providing a signal splitter capable of uniform operation through a wide range of frequencies.

The invention has the further object of providing a signal splitter in which signals from one output port are not transmitted into another output port.

The invention has the further object of providing a signal splitter in which signals flowing back from an output branch circuit are not reflected back into the branch circuit.

The invention has the further object of providing a signal splitter which can conveniently be made using surface mount technology.

The invention has the further object of overcoming the problems associated with leakage inductance in autotransformers operating at frequencies up to 1 GHz.

The invention has the further object of providing a signal splitter in which input and output impedances can be easily matched.

The invention has the further object of providing a signal splitter in which impedance matching is independent of the means for overcoming phase shifts due to leakage inductance.

The person skilled in the art will recognize other objects and advantages of the present invention, from a reading of the following brief description of the drawings, the detailed description of the invention, and the appended claims.

DETAILED DESCRIPTION OF THE INVENTION

Figure 1:
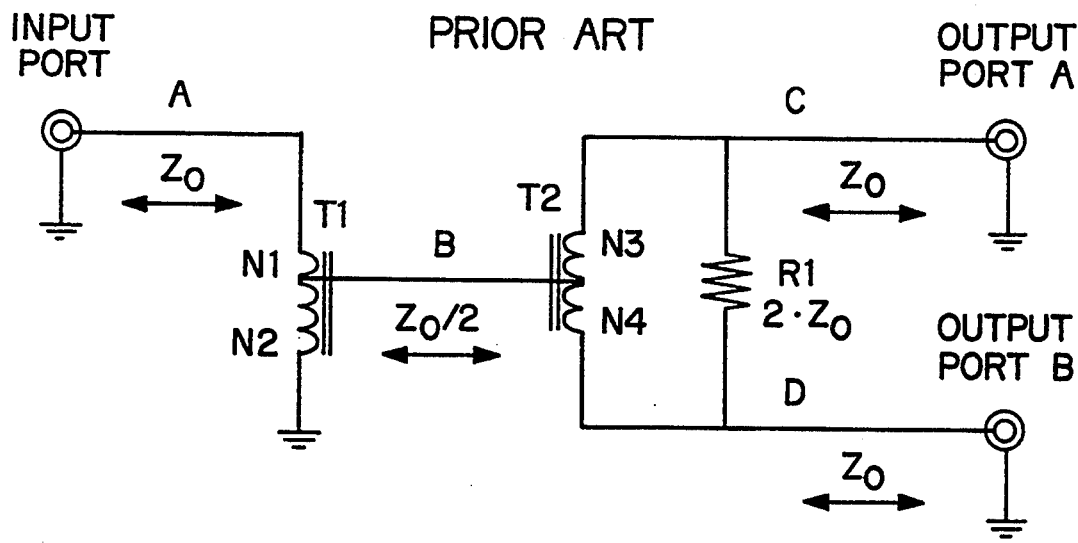
FIG. 1 provides a schematic diagram of a signal splitter circuit of the prior art.
Figure 2:
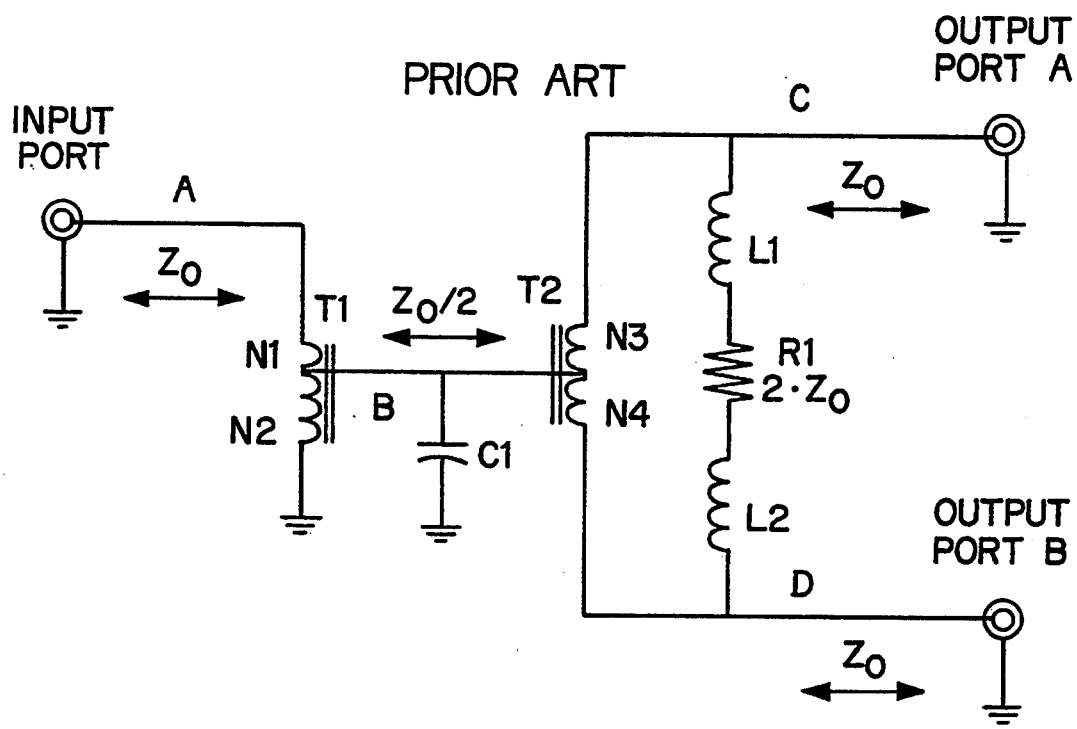
FIG. 2 provides a schematic diagram of another signal splitter circuit of the prior art, wherein the circuit provides some compensation for leakage inductance at high frequencies.
Figure 3:
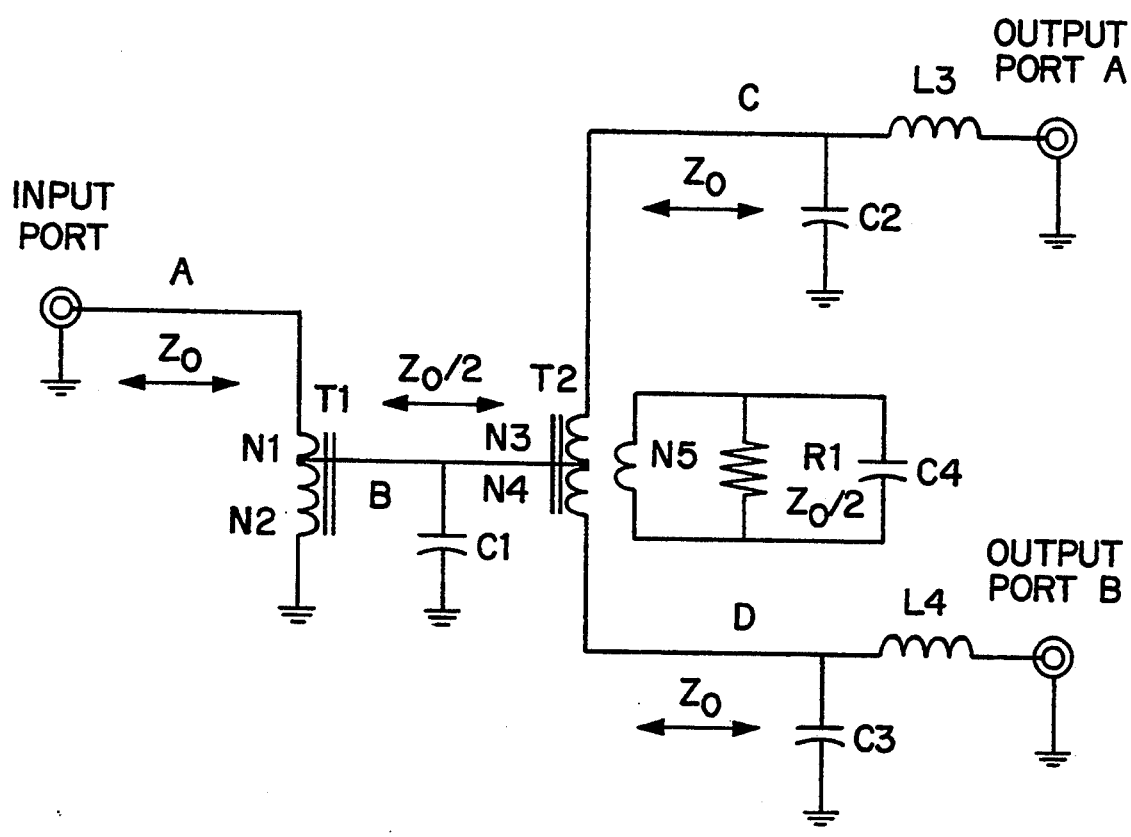
FIG. 3 provides a schematic diagram of the signal splitter circuit of the present invention.

FIG. 3 shows a schematic diagram of a circuit made according to the present invention. In the circuit of FIG. 3, a signal applied at the input port appears at output ports A and B. Autotransformer T1 functions in a similar manner to autotransformers T1 in FIG. 1 and 2. Thus, the labeled impedances ($Z_o$) are similar to those obtained in the prior figures. Components of FIG. 3 which have the same function as components of FIG. 1 and 2 are labeled with similar reference numerals.

As in the prior art, the signals appearing at the output ports can be connected to the inputs of similar splitter circuits. Thus, a plurality of identical splitter circuits can be cascaded together, so that a head-end signal is split into a large number of output signals.

The signal splitter of FIG. 3 includes a bridge load circuit which, in the embodiment of FIG. 3, comprises a transformer winding N5 (nominally chosen to have the same number of turns as the windings N3 and N4), load resistor R1, having a value $Z_o/2$, and capacitor C4, connected in parallel to R1 as shown. In the preferred embodiment, the bridge load circuit has no connection to the signal splitter circuit except through the inductive coupling of winding N5 to windings N3 and N4. In other words, the bridge load circuit "floats", because it is not directly connected to the main circuit.

Due to the magnetic coupling of N5 with N3 and N4, the circuit "sees" resistor R1 as if it were connected directly across N3 or N4. For this reason, in the arrangement of FIG. 3, there are, in effect, two series load impedances applied to each output port, namely, the source impedance, transformed by a factor of 2 by T1 to $Z_o/2$, and the load impedance R1, having a value of $Z_o/2$, coupled to either N3 or N4 without impedance scaling. When these two impedances are chosen to be equal, and when N3 is chosen to equal N4, a signal originating at one output port does not appear at the other output port.

A major difference between the circuit of FIG. 2 and the circuit of FIG. 3 is that, because of the inductive coupling of the bridge load circuit in FIG. 3, the series leakage inductances of windings N3 and N4 are outside of the bridge load circuit. The result is that the phase shifts which plague the circuit of FIG. 2 are not a problem in the circuit of FIG. 3.

Capacitance C4 compensates for the series leakage inductance in N5 and the windings N3 or N4 of transformer T2 in exactly the same manner that C1 compensates for leakage inductance of windings N1 and N2 of transformer T1. Both of these compensations function identically to insure that the transformed $Z_o/2$ load impedances are equal over the frequency range of the splitter. It is easy to insure that these transformed load impedances are equal, balancing the bridge and preventing signals entering one output port from appearing at the other port. Note, however, that C4 can be omitted if the values of the other circuit components are correctly chosen.

In the circuit of FIG. 3, capacitors C1, C2, and C3, and inductors L3 and L4 together comprise the components which provide satisfactory impedance matching at both the input and output ports. In particular, since the output port connectors commonly used in CATV systems have capacitance with respect to ground, inductors L3 and L4 can be used to compensate. One could also compensate for such capacitance by varying C1, but one cannot achieve satisfactory compensation by changing C1 alone, without disturbing the output isolation. It turns out that L3, C2 (or part thereof), and the output capacitance of the output port connector together form a pi transmission line section; a similar statement holds true for L4, C3, and the capacitance of the connector of output port B. Note also that each of C2 and C3 can be visualized as two capacitors connected in parallel, with one of the capacitors being used to compensate for unequal leakage inductances of T1 and T2.

The circuit designer has direct control of the values of C1, C2, C3, L3, and L4. Thus, the designer has control of at least one element in each transmission line half-section. Thus, it is easy to choose values for these components which will provide optimum impedance matching and, simultaneously, optimum output isolation. Moreover, since the series leakage impedance of the windings of T2 are not in the path of R1, the circuit completely eliminates the high frequency phase shift problem. The load resistor R1 can have much lower impedance, and is easier to realize at high frequencies. The relatively high value inductors L1 and L2 of FIG. 2 are eliminated; the inductors L3 and L4 of FIG. 3 are much smaller, and can be realized as simple printed circuit board strip-line inductors.

The preferred design of T2 is to use the same number of turns for the N3, N4, and N5 windings. The turns of these windings can then be wound tri-filar (interspersed) which significantly reduces the series leakage inductances of these windings.

In the case wherein the output impedances are equal, and wherein N3=N4=N5, the value of R1 is chosen to be $Z_o/2$. In the more general case, wherein N3=N4, but N5 does not necessarily equal N3, the value of R1 is given as $(Z_o/2)(N5/N3)^2$, which reduces to $Z_o/2$ when N3=N5. If the output impedances are not equal, R1 must be chosen such that the output impedance matches the input impedance.

The signal splitter circuit of the present invention is especially suited for implementation in surface mount technology (SMT). For frequencies of 1 GHz, SMT is a virtual necessity for acceptable realization of many circuit components. SMT significantly reduces the size of the active circuit, and minimizes the use of inductive components. It is especially important to use an SMT component in realizing C1, where the lead inductance of through-hole components is unacceptable even at 500 MHz. The improved impedance consistency of SMT construction significantly reduces the need for manual adjustment of the circuit. To achieve this advantage of SMT, all relatively high-value inductors, which cannot be practically implemented in SMT, have been eliminated in the present invention. The two remaining inductors (L3 and L4) are of low value and are in non-critical locations. If shielding is not critical, these inductors can even be implemented by meander or PCB transmission line segments.

In mounting transformer cores to a circuit board using SMT, it has been found advantageous to mount the cores to the underside of the board. However, at the high frequencies of interest here, the cores are both inductive and capacitive, and so it becomes necessary to control the dielectric between the winding and the circuit board. A preferred means of mounting the core to the circuit board is to use a piece of doublesided ridged foam adhesive, of the type commonly used in mounting pictures to walls. The foam adhesive makes it possible to mount the core to the circuit board with consistent spacing, and also provides a dielectric having a known and low dielectric constant, for the capacitor defined by the core and the circuit board.

In a modification of the present invention, it is also possible to provide a bridge load circuit which is only partially "floating". In this alternative, one could ground either end of the bridge load circuit, while maintaining the inductive coupling described above. In this case, there is still no direct path from one output port, through the load, and to the other output port.

While the invention has been described with respect to particular embodiments, many further variations are possible. Such modifications as will be apparent to those skilled in the art should be considered within the spirit and scope of the following claims.

What is claimed is:

1. A signal splitter circuit for use in a CATV system, comprising:
   a) an input port and two output ports,
   b) an autotransformer having a pair of inductively coupled coils, the coils having ends connected to the output ports, the coils being connected to the input port, and
   c) a bridge load circuit, the bridge load circuit comprising a coil connected in parallel with a load, the coil being inductively coupled to at least a portion of the autotransformer, wherein the bridge load circuit is free of any connection to the signal splitter circuit other than through inductive coupling to the autotransformer.

2. The circuit of claim 1, further comprising an inductor in series with at least one of the output ports, and a capacitor in parallel with at least one of the output ports.

3. The circuit of claim 1, wherein the bridge load circuit further comprises a capacitor connected in parallel with the load.

4. The circuit of claim 2, wherein the autotransformer is connected to the input port at a center tap, and wherein there is a capacitor connected between the center tap and ground.

5. A signal splitter circuit for use in a CATV system, comprising:
   a) an input port and two output ports,
   b) a first autotransformer connected between the input port and ground,
   c) a second autotransformer connected between the two output ports, the first and second autotransformers being electrically connected together and being also connected to a capacitor,
   d) a bridge load circuit comprising an inductor, a resistor, and a capacitor, all connected in parallel, the inductor of the bridge load circuit being inductively coupled to the second autotransformer, wherein the bridge load circuit is free of any other connection with the splitter circuit, and
   e) inductors connected in series with the output ports, and capacitors connected in parallel with the output ports.

6. A signal splitter circuit, for use at high frequencies, the circuit comprising an input port and two output ports, the input port being connected to an autotransformer, the autotransformer being connected to the two output ports, and a bridge load circuit comprising a transformer winding and a load connected in parallel, the winding of the bridge load circuit being inductively coupled to the autotransformer, the bridge load circuit being free of any direct connection to the signal splitter circuit.

7. The circuit of claim 6, further comprising a capacitor connected in parallel with the load in the bridge load circuit.

8. The circuit of claim 6, further comprising at least one inductor connected in series with at least one of the output ports.

9. The circuit of claim 8, further comprising at least one capacitor connected in parallel with at least one of the output ports.

10. The circuit of claim 9, wherein the input port is connected to the autotransformer at a point, and wherein there is a capacitor connected between said point and ground.

11. A signal splitter circuit for use in a CATV system, comprising:
    a) an input port and two output ports,
    b) an autotransformer having a pair of inductively coupled coils, the coils having ends connected to the output ports, the coils being connected to the input port, and
    c) a bridge load circuit, the bridge load circuit comprising a coil connected in parallel with a load, the coil of the bridge load circuit being inductively coupled to at least a portion of the autotransformer, wherein the circuit is free of any direct path from one output port, through the load, and to the other output port.

12. The circuit of claim 11, further comprising an inductor in series with at least one of the output ports, and a capacitor in parallel with at least one of the output ports.

13. The circuit of claim 11, wherein the bridge load circuit further comprises a capacitor connected in parallel with the load.

14. The circuit of claim 12, wherein the autotransformer is connected to the input port at a center tap, and wherein there is a capacitor connected between the center tap and ground.

* * * * *